United States Patent
Lee et al.

(10) Patent No.: US 9,500,342 B2
(45) Date of Patent: Nov. 22, 2016

(54) LIGHT EMITTING DEVICE

(71) Applicant: Au Optronics Corporation, Hsinchu (TW)

(72) Inventors: Chia-Hwa Lee, Taipei (TW); Hsueh-Yen Yang, Taoyuan County (TW); Pi-Cheng Wu, Taipei (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 14/476,754

(22) Filed: Sep. 4, 2014

(65) Prior Publication Data
US 2015/0300599 A1   Oct. 22, 2015

(30) Foreign Application Priority Data

Apr. 22, 2014   (TW) .............................. 103114520 A

(51) Int. Cl.
*F21V 9/08* (2006.01)
*H01L 27/32* (2006.01)

(52) U.S. Cl.
CPC ............. *F21V 9/08* (2013.01); *H01L 27/3218* (2013.01); *H01L 27/3223* (2013.01)

(58) Field of Classification Search
CPC ............. H01L 27/3213; H01L 27/322; H01L 51/5036; H01L 27/3223; H01L 27/3218; G02B 5/223; G02B 5/201; F21V 9/08
USPC .................................. 313/498–512, 112, 113
See application file for complete search history.

(56) References Cited

U.S. PATENT DOCUMENTS

| | | | |
|---|---|---|---|
| 388,996 A | 9/1888 | Mueller | |
| 557,386 A | 3/1896 | Heath | |
| 8,558,222 B2 | 10/2013 | Hwang et al. | |
| 8,587,499 B2 | 11/2013 | Kang et al. | |
| 8,766,299 B2 * | 7/2014 | Iwasaki | 257/98 |
| 8,884,509 B2 * | 11/2014 | Matsukura | 313/501 |
| 2004/0195963 A1 * | 10/2004 | Choi et al. | 313/504 |
| 2004/0251821 A1 * | 12/2004 | Cok | 313/506 |
| 2005/0040756 A1 * | 2/2005 | Winters et al. | 313/504 |
| 2006/0082295 A1 * | 4/2006 | Chin et al. | 313/506 |
| 2008/0185959 A1 * | 8/2008 | Kurauchi | 313/504 |
| 2008/0218070 A1 * | 9/2008 | Kobayashi | 313/506 |
| 2008/0218071 A1 * | 9/2008 | Kobayashi | 313/506 |
| 2008/0258608 A1 * | 10/2008 | Chao et al. | 313/504 |
| 2010/0052524 A1 * | 3/2010 | Kinoshita | 313/504 |
| 2010/0060148 A1 * | 3/2010 | Hwang et al. | 313/504 |

(Continued)

FOREIGN PATENT DOCUMENTS

| | | |
|---|---|---|
| CN | 101958340 | 1/2011 |
| CN | 102130148 | 7/2011 |

(Continued)

*Primary Examiner* — Donald Raleigh
*Assistant Examiner* — Kevin Quarterman
(74) *Attorney, Agent, or Firm* — Jianq Chyun IP Office

(57) ABSTRACT

A light emitting device including a plurality of units is provided. Each unit includes a light emitting region and a light-transmitting region, wherein in at least one unit, at least two sides of the light emitting region are surrounded by the light-transmitting region.

11 Claims, 8 Drawing Sheets

(56) References Cited

U.S. PATENT DOCUMENTS

| | | |
|---|---|---|
| 2011/0012816 A1 | 1/2011 | Kang et al. |
| 2011/0147770 A1 | 6/2011 | Hwang et al. |
| 2011/0163661 A1* | 7/2011 | Lee et al. ............... 313/504 |
| 2011/0215712 A1* | 9/2011 | Hong ............... 313/504 |
| 2012/0022006 A1 | 1/2012 | Beltzer et al. |
| 2012/0206038 A1* | 8/2012 | Hatano ............... 313/505 |
| 2013/0014542 A1 | 1/2013 | Anderson |
| 2013/0037652 A1 | 2/2013 | van der Westhuizen |
| 2013/0119857 A1* | 5/2013 | Su et al. ............... 313/504 |

FOREIGN PATENT DOCUMENTS

| | | |
|---|---|---|
| CN | 102623462 | 8/2012 |
| TW | I352239 | 11/2011 |

\* cited by examiner

FIG. 1 (PRIOR ART)

LIGHT EMITTING DEVICE

CROSS-REFERENCE TO RELATED APPLICATION

This application claims the priority benefit of Taiwan application serial no. 103114520, filed on Apr. 22, 2014. The entirety of the above-mentioned patent application is hereby incorporated by reference herein and made a part of this specification.

BACKGROUND OF THE INVENTION

Field of the Invention

The invention relates to a device, and more particularly, to a light emitting device.

Description of Related Art

A transparent display panel refers to the display panel having a certain degree of transmittance, which is capable of clearly displaying the background behind the panel. The transparent display panel is applicable to a variety of fields such as windows of buildings, car windows, and shop windows. In addition to the function of transparent display, the transparent display panel has a potential of serving as an information display panel in the future, and hence the transparent display panel has drawn much market attention.

FIG. 1 illustrates a schematic diagram of a conventional transparent display panel. Please refer to FIG. 1. The display panel 100 is a transparent display panel of an Active-Matrix Organic light emitting Diode (AMOLED), which includes a plurality of pixel units 110. Each pixel unit 110 includes a plurality of color sub-pixels PA, PB, PC, and a plurality of white sub-pixels PW, wherein the color sub-pixels PA, PB, PC are, for example, for displaying red color, green color, or blue color. In general, one white sub-pixel PW is correspondingly disposed beneath one color sub-pixels PA, PB, PC. As a result, the white sub-pixels PW of the plurality of pixel units 110 alongside are arranged in a row, and thus in a stripe-like distribution. The white sub-pixels PW are light-transmitting regions in the transparent display panel 100, in which the background behind the panel is able to be clearly displayed.

However, when the display screen is perpendicular or parallel to the light-transmitting regions which are in the stripe-like distribution, the display screen may be discontinuous or have significant bright lines and dark lines. In a fixed display panel, the see-through patterns may be adjusted accordingly to prevent the poor display quality above from being occurred. However, in the display panels of hand-held devices such as mobile phones, the display screen thereof may be rotated according to the user's needs, and the light-transmitting regions above-mentioned which are in the stripe-like distribution may have various changes accordingly. Thus, the situations that the display screen is discontinuous or has significant bright lines and dark lines are obvious and difficult to be resolved. Accordingly, a pixel design which may enhance the display quality of the transparent display panel is needed in the field.

SUMMARY OF THE INVENTION

The invention provides a light emitting device, wherein at least two sides of a light emitting region are surrounded by a light-transmitting region. The light emitting device may be served as a uniform light source or a display panel with an improved see-through quality.

The light emitting device of the invention includes a plurality of units. Each unit includes a light emitting region and a light-transmitting region, wherein in at least one unit, at least two sides of the light emitting region are surrounded by the light-transmitting region.

In one embodiment of the invention, the light emitting region of the at least one unit is located at a corner of the unit, so that two sides of the light emitting region are surrounded by the light-transmitting region.

In one embodiment of the invention, the light emitting region of the at least one unit is located at one side of the unit, so that three sides of the light emitting region are surrounded by the light-transmitting region.

In one embodiment of the invention, the light emitting region of the at least one unit is located at a center of the unit, and the light-transmitting region is located at a periphery of the unit, so that the light emitting region is encircled by the light-transmitting region.

In one embodiment of the invention, the light-transmitting regions of the units form a light-transmitting mesh pattern. The light-transmitting mesh pattern includes a plurality of openings, wherein the openings correspond to the light emitting regions of the units.

In one embodiment of the invention, each unit includes a first colored light region, a second colored light region, and a third colored light region which are disposed in the light emitting region, and each unit includes a transparent region which is disposed in the light-transmitting region.

In one embodiment of the invention, the first colored light region includes a first color light emitting layer, the second colored light region includes a second color light emitting layer, the third colored light region includes a third color light emitting layer, and the transparent region includes a white light emitting layer or a transparent layer.

In one embodiment of the invention, the first colored light region includes a first color filter pattern, the second colored light region includes a second color filter pattern, the third colored light region includes a third color filter pattern, and the transparent region includes a transparent color filter pattern or a white color filter pattern.

In one embodiment of the invention, the light emitting device further includes an active device layer and a display medium layer, wherein the display medium layer is disposed between the active device layer and the first color filter pattern, the second color filter pattern, and the third color filter pattern.

In one embodiment of the invention, the light emitting device further includes an active device layer and a display medium layer, wherein the first color filter pattern, the second color filter pattern, and the third color filter pattern are disposed between the active device layer and the display medium layer.

According to the above, in the units of light emitting device of the invention, the light-transmitting regions are designed to surround at least two sides of the light emitting region, so that the light-transmitting regions and the light emitting regions are disposed in interlace, and the light-transmitting regions are uniformly dispersed in the light emitting device. Therefore, when the light emitting device serves as the light source, it may emit light uniformly; when the light emitting device serves as the display panel, it may prevent the display screen from being discontinuous or having significant bright lines and dark lines, so that the display panel may have an improved display quality.

In order to make the aforementioned and other features and advantages of the invention comprehensible, embodiments accompanied with figures are described in detail below.

BRIEF DESCRIPTION OF THE DRAWINGS

FIG. 1 illustrates a schematic diagram of a conventional transparent display panel.

DESCRIPTION OF EMBODIMENTS

Figure 2A:
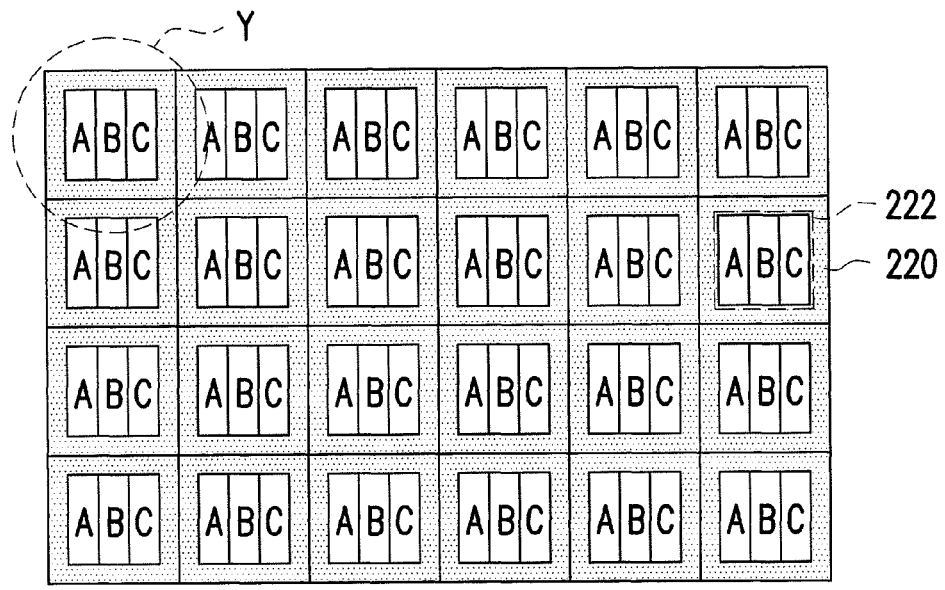
FIG. 2A illustrates a schematic diagram of a top view of a light emitting device according to an embodiment of the invention.
Figure 2B:
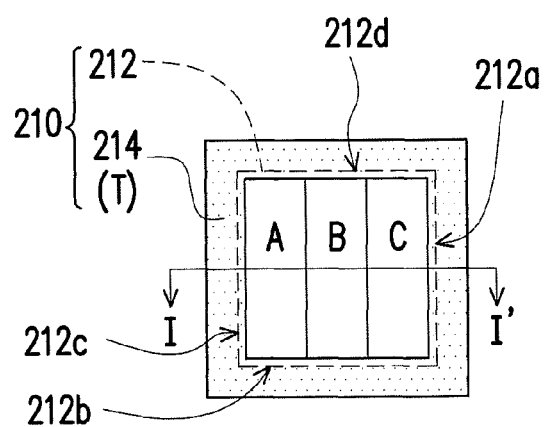
FIG. 2B illustrates a schematic diagram of an enlarged view of a region Y of the light emitting device in FIG. 2A.
Figure 2C:
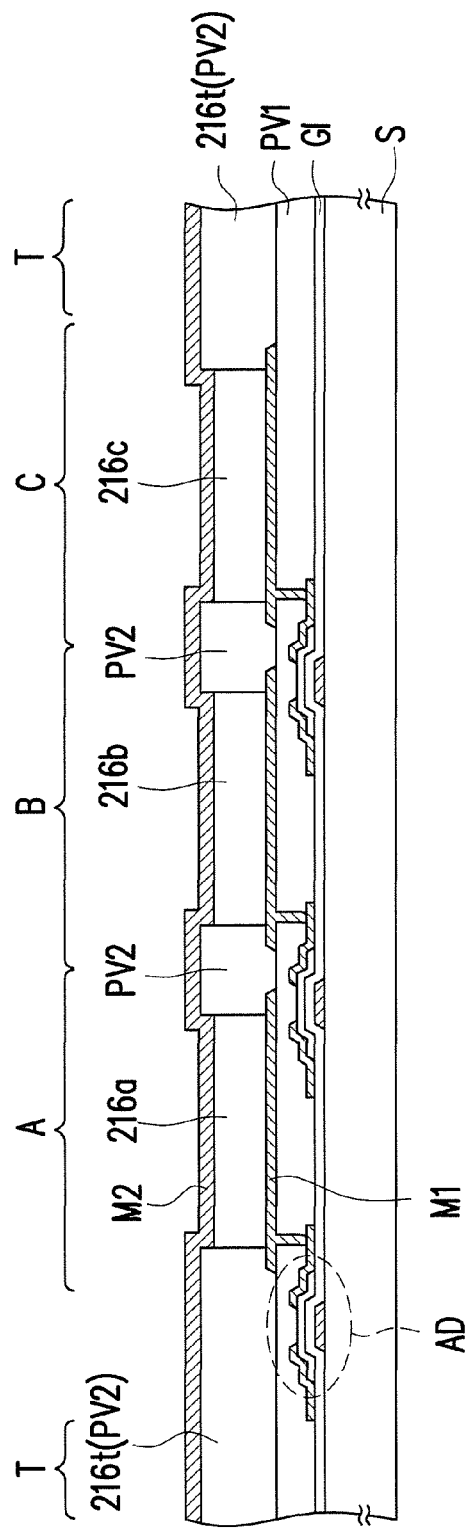
FIG. 2C illustrates a schematic diagram of a sectional view along a line I-I' of the light emitting device in FIG. 2B.

FIG. 2A illustrates a schematic diagram of a top view of a light emitting device according to an embodiment of the invention. FIG. 2B illustrates a schematic diagram of an enlarged view of a region Y of the light emitting device in FIG. 2A. FIG. 2C illustrates a schematic diagram of a sectional view along a line I-I' of the light emitting device in FIG. 2B. Please refer to FIG. 2A to FIG. 2C simultaneously, a light emitting device 200 includes a plurality of units 210. The units 210 are arranged, for example, in an array. In the present embodiment, the units 210 are exemplified as being arranged in a 6×4 array, but the invention is not limited thereto.

Each unit 210 includes a light emitting region 212 and a light-transmitting region 214, wherein in at least one unit 210, at least two sides of 212a, 212b, 212c, 212d of the light emitting region 212 are surrounded by the light-transmitting region 214. In the present embodiment, the light emitting region 212 of at least one unit 210 is located at a center of the unit 210, and the light-transmitting region 214 is located at a periphery of the unit 210, so that the light emitting region 212 is encircled by the light-transmitting region 214. In other words, a shape of the top view of the light-transmitting region 214 is such as a rectangle with an opening in the center thereof. In the present embodiment, the light emitting region 212 is exemplified as a rectangle, so that the four sides 212a, 212b, 212c, 212d of the light emitting region 212 are, for example, encircled by the light-transmitting region 214. However, the invention is not limited thereto. In an embodiment, the light emitting region 212 may have other shapes. For example, the first colored light region A, the second colored light region B, and the third colored light region C of the light emitting region 212 may respectively be polygons such as hexagons, and the first colored light region A, the second colored light region B, and the third colored light region C are connected to each other, wherein the light emitting region 212 is encircled by the light-transmitting region 214. That is, the light emitting region 212 is, for example, located at the opening of the light-transmitting region 214. Therefore, to take the distribution range of the plurality of units 210 as an entire region, the plurality of light emitting regions 212 and the plurality of light-transmitting regions 214 are, for example, disposed in interlace, and the plurality of light-transmitting regions 214 are uniformly dispersed in the distribution region of the plurality of units 210. In the present embodiment, for example, a transparent region T of the unit 210 forms a light-transmitting mesh pattern 220. The light-transmitting mesh pattern 220 includes a plurality of openings 222, and the openings 222 correspond to the light emitting regions 212 of the unit 210.

In the present embodiment, for example, each unit 210 includes the first colored light region A, the second colored light region B, and the third colored light region C which are disposed in the light emitting region 212, and each unit 210 includes a transparent region T which is disposed in the light-transmitting region 214, wherein the transparent region T is represented by gray dots. In the present embodiment, the light emitting device 200 is, for example, an organic electroluminescent device, wherein the first colored light region A can include the first color light emitting layer 216a, the second colored light region B can include the second color light emitting layer 216b, the third colored light region C can include the third color light emitting layer 216c, and the transparent region T can include the transparent layer 216t. In another embodiment, the transparent region T may also include a white light emitting layer. For example, the first color light emitting layer 216a, the second color light emitting layer 216b, and the third color light emitting layer 216c are red light emitting layer, green light emitting layer, and blue light emitting layer, respectively. For example, the transparent region T is the region which emits white light or the region which is merely translucent and is not luminous.

Particularly, with various driving modes, the light emitting device 200 may merely be the light emitting device for a light source, or may be a display panel for displaying image. In the present embodiment, the light emitting device 200 is used with the timing-control driving mode for displaying image, and thus the light emitting device 200 may display image. Accordingly, the light emitting region 212 may be also referred to a display region. The first colored light region A, the second colored light region B, and the third colored light region C may be also referred to the first color sub-pixel, the second color sub-pixel, and the third color sub-pixel, respectively. The transparent region T may be also referred to a transparent sub-pixel. For example, in the present embodiment, the first colored light region A, the second colored light region B, and the third colored light region C may respectively be sub-pixel structures of the organic electroluminescent display device, wherein the first colored light region A, the second colored light region B, and the third colored light region C may be a red sub-pixel, a green sub-pixel, and a blue sub-pixel, respectively, but the invention is not limited thereto. In other words, the first colored light region A, the second colored light region B, and the third colored light region C may also be a blue sub-pixel, a red sub-pixel, and a green sub-pixel, respectively. The transparent sub-pixel is, for example, a region substantially emits white light or completely transparent.

In the present embodiment, for example, the first colored light region A, the second colored light region B, and the third colored light region C further include a substrate S, a scan line (not shown), a data line (not shown), a power line (not shown), an active device AD, a gate insulating layer GI, protective layers PV1, PV2, the first electrode layer M1, and the second electrode layer M2, respectively. The first electrode layer M1 is one of a cathode and an anode, and the second electrode layer M2 is another one of the cathode and the anode. Materials of the first electrode layer M1 and the second electrode layer M2 are, for example, transparent conductive materials such as indium tin oxides.

In another embodiment, when the light emitting device 200 serves as the light source, the first colored light region A, the second colored light region B, and the third colored light region C in the light emitting region 212 may emit light together, so that the light emitting device 200 may substantially be as a white light source, wherein the transparent region T is the region which is translucent and is not luminous. Certainly, the first colored light region A, the second colored light region B, or the third colored light region C may also emit light respectively, so that the light emitting device 200 may merely emit the first colored light, the second colored light, or the third colored light, or combinations thereof depending on the need. Moreover, in the embodiment of which the light emitting device 200 serves as the light source, the light emitting region 212 may also merely be composed of the single colored light region, that is, the light emitting region 212 may merely emit a monochromatic light. Furthermore, although the light emitting region 212 is exemplified as including three colored light regions in all of the above embodiments, but the invention is not limited thereto. In other words, in other embodiments, the light emitting region may also include other numbers of the colored light regions.

Figure 3:
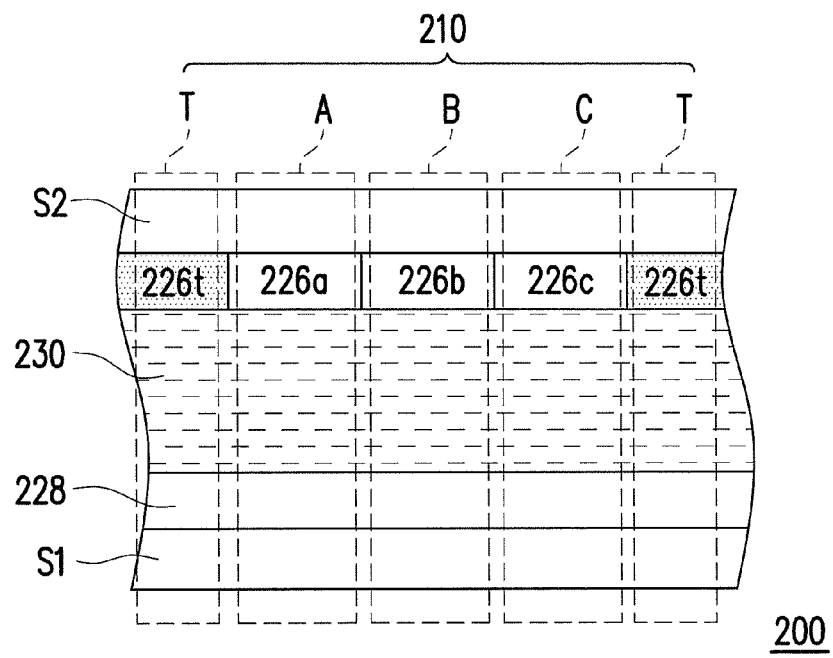
FIG. 3 illustrates a schematic diagram of a sectional view of a light emitting device according to an embodiment of the invention.
Figure 4:
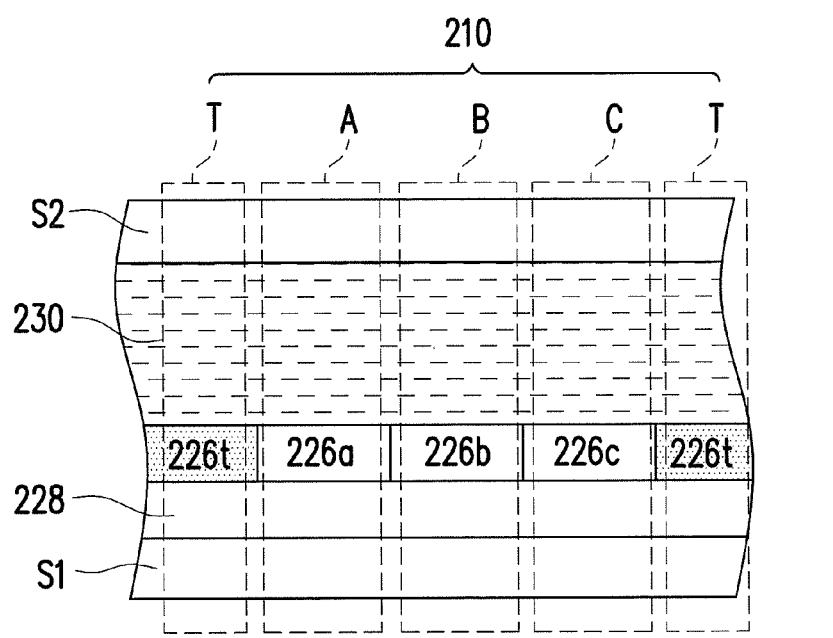
FIG. 4 illustrates a schematic diagram of a sectional view of a light emitting device according to an embodiment of the invention.

In another embodiment, the light emitting device 200 may also be the display panel with a display medium layer. FIG. 3 and FIG. 4 illustrate schematic diagrams of sectional views of light emitting devices according to embodiments of the invention respectively. The top views of FIG. 3 and FIG. 4 may refer to FIG. 2A and FIG. 2B. Please refer to FIG. 3, in the light emitting device 200 of the present embodiment, for example, the first colored light region A includes the first color filter pattern 226a, the second colored light region B includes the second color filter pattern 226b, the third colored light region C includes the third color filter pattern 226c, and the transparent region T includes a transparent color filter pattern 226t. In an embodiment, the transparent region T may also include a white color filter pattern. For example, the first color filter pattern 226a, the second color filter pattern 226b, the third color filter pattern 226c, and the transparent color filter pattern (or the white color filter pattern) 226t form a color filter layer. The first color filter pattern 226a, the second color filter pattern 226b, and the third color filter pattern 226c can be red color filter pattern, green color filter pattern, and blue color filter pattern, respectively.

In the present embodiment, the first colored light region A, the second colored light region B, and the third colored light region C can further include substrates S1, S2, an active device layer 228, and a display medium layer 230, respectively. The active device layer 228 includes components such as a scan line (not shown), a data line (not shown), an active device (not shown), a gate insulating layer (not shown), a protective layer (not shown), and a pixel electrode (not shown). The display medium layer 230 can include display mediums such as liquid crystal. In the present embodiment, the display medium layer 230 can be disposed between at least one of the first color filter pattern 226a, the second color filter pattern 226b, and the third color filter pattern 226c and the active device layer 228. That is, the first color filter pattern 226a, the second color filter pattern 226b, and the third color filter pattern 226c, and the active device layer 228 are located at opposite sides of the display medium layer 230, respectively. However, the invention is not limited thereto. For example, in another embodiment, as shown in the light emitting device 200 in FIG. 4, the first color filter pattern 226a, the second color filter pattern 226b, and the third color filter pattern 226c may also be disposed between the active device layer 228 and the display medium layer 230. That is, the light emitting device 200 has a structure of Color Filter on Array (COA).

In another embodiment, if the light emitting device of the invention is an electrophoretic light emitting device, the first colored light region A, the second colored light region B, and the third colored light region C are sub-pixel structures of the electrophoretic light emitting device, respectively, wherein the first colored light region A, the second colored light region B, and the third colored light region C include components such as a scan line, a data line, an active device, a pixel electrode, an electrophoretic display layer, and a counter electrode. As mentioned above, the invention does not limit the type of the light emitting device, so that structures of the first colored light region, the second colored light region, and the third colored light region vary according to the type of the light emitting device.

In addition to the first colored light region A, the second colored light region B, and the third colored light region C above, the transparent region T is the sub-pixel region without display components. Accordingly, the transparent region T may merely have metal lines or wires for transmitting driving signals to the color sub-pixel in the first colored light region A, the second colored light region B, and the third colored light region C. Alternately, there is no lines or wires disposed in the transparent region T; the invention is not limited thereto. Since the transparent region T is without display components, the transparent region may have excellent transparency or transmittance. According to the above embodiments, the pixel units 210 in the display panel 200 are configured with the transparent regions T. When the display panel 200 is in an "off" state, the display panel 200 may appear to be transparent due to the transparent region T, so that the users may view the scene behind the display panel 200.

Figure 5A:
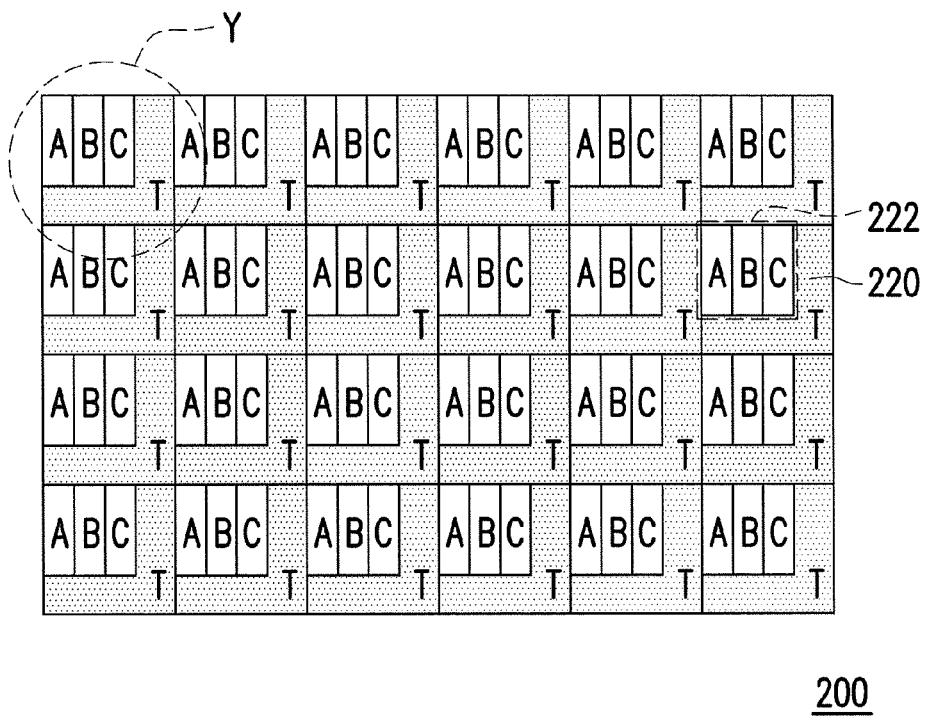
FIG. 5A illustrates a schematic diagram of a light emitting device according to an embodiment of the invention.
Figure 5B:
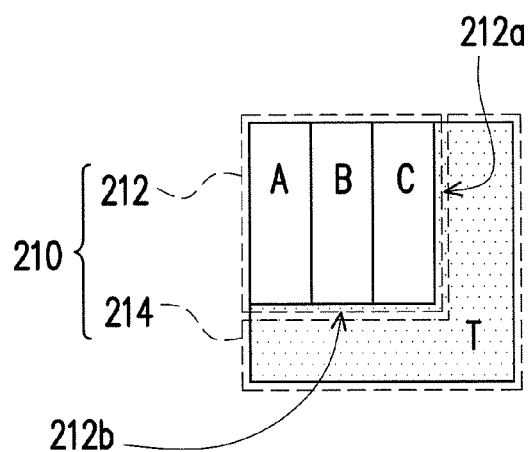
FIG. 5B illustrates a schematic diagram of an enlarged view of a region Y of the light emitting device in FIG. 5A.
Figure 6A:
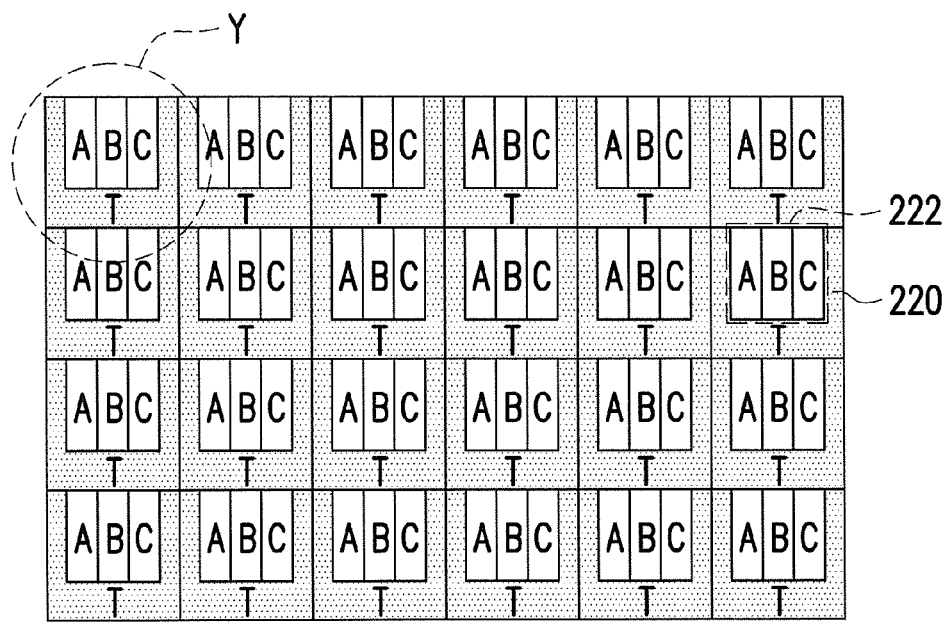
FIG. 6A illustrates a schematic diagram of a light emitting device according to an embodiment of the invention.
Figure 6B:
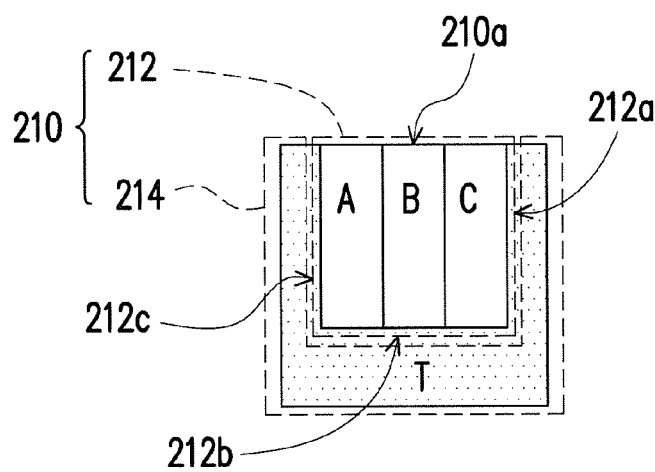
FIG. 6B illustrates a schematic diagram of an enlarged view of a region Y of the light emitting device in FIG. 6A.

FIG. 5A and FIG. 5B and FIG. 6A and FIG. 6B illustrate schematic diagrams of the light emitting devices according to embodiments of the invention, respectively. Please refer to FIG. 5A to FIG. 6B, the embodiments of FIG. 5A to FIG. 6B are similar to the embodiment of FIG. 2A. Therefore, the identical components are represented by the identical symbols and the illustrations thereof are not repeated herein. In FIG. 5A and FIG. 5B, the light emitting region 212 of at least one unit 210 is, for example, located at the corner of the unit 210, so that two sides 212a, 212b of the light emitting region 212 are surrounded by the light-transmitting region 214. In FIG. 6A and FIG. 6B, the light emitting region 212 of at least one unit 210 is located at one side 210a of unit 210, so that three sides 212a, 212b, 212c of the light emitting region 212 are surrounded by the light-transmitting region 214.

It is noted that although the light emitting region 212 and the light-transmitting region 214 of each unit 210 in the light emitting device 200 are exemplified as having the identical configuration in the above embodiments, the light emitting region 212 and the light-transmitting region 214 of each unit 210 in each light emitting device 200 may have various configurations in other embodiments. For example, in an embodiment, as long as the plurality of light-transmitting regions 214 are not formed together into stripe-like penetrating pattern, the light emitting region 212 of each unit 210 as shown in FIG. 5A and FIG. 5B may be located at different corners of the unit 210, or, the light emitting region 212 of each unit 210 as shown in FIG. 6A and FIG. 6B may be located at different sides of the unit 210. Moreover, in an embodiment, the light emitting device may also include at least one unit shown in FIG. 2A and FIG. 5A to FIG. 6B and units with other structures.

According to the above, in the above embodiments, the plurality of light emitting regions 212 and the plurality of light-transmitting regions 214 are, for example, disposed in interlace, which means that the light-transmitting region 214 of the light emitting device 200 are uniformly dispersed in the distribution region of the plurality of units 210. That is, the plurality of light-transmitting regions 214 of the light emitting device 200 substantially form the mesh light-transmitting region 220, instead of being arranged in multiple rows. Therefore, when the light emitting device 200 serves as the display panel, the layout of the light-transmitting regions 214 in the above embodiments may prevent the display screen from being discontinuous or having significant bright lines and dark lines, which is due to the conventional light-transmitting region in a stripe-like distribution, thereby the display quality of the panel may be improved significantly. Specifically, when serving as the display panel, even the display screen of the light emitting device 200 is rotated according to the user's needs, the plurality of light emitting regions 212 and the plurality of light-transmitting regions 214 of the above embodiments may still be disposed in interlace. Accordingly, the layout of the light-transmitting regions 214 in the above embodiments is applicable to both fixed display devices and hand-held display devices and significantly enhances the display quality of the transparent light emitting device 200. On the other hand, when the light emitting device 200 serves as the light source, the light emitting device 200 has the advantage of uniform light emission.

The light emitting device of the invention which serves as the display panel is demonstrated to have good display effects by the following experiments.

Figure 1:
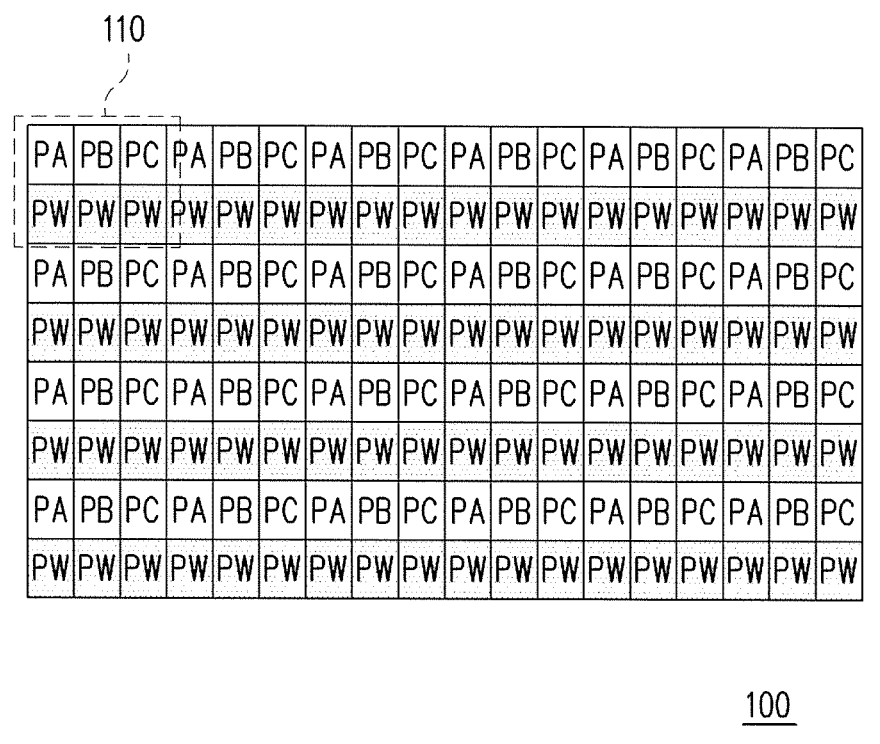
Figure 7:
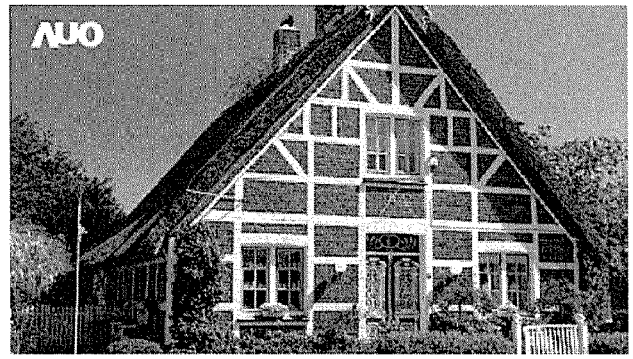
FIG. 7 is a pattern to be displayed for conducting experiments.
Figure 8A:
FIG. 8A is an image of FIG. 7 displayed by the conventional display panel in FIG. 1.
Figure 8B:
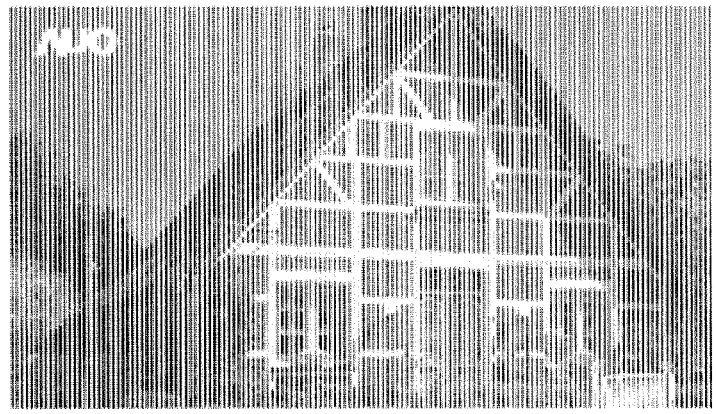
FIG. 8B is an image of FIG. 7 displayed by the conventional display panel in FIG. 1 which is rotated 90 degrees.
Figure 9A:
FIG. 9A is an image of FIG. 7 displayed by the display panel of the embodiment of the invention in FIG. 2A.
Figure 9B:
FIG. 9B is an image of FIG. 7 displayed by the display panel in FIG. 2A which is rotated 90 degrees.

FIG. 7 is a pattern to be displayed for conducting the following experiments. FIG. 8A is an image of FIG. 7 displayed by the conventional display panel in FIG. 1. FIG. 8B is an image of FIG. 7 displayed by the conventional display panel in FIG. 1 which is rotated 90 degrees. FIG. 9A is an image of FIG. 7 displayed by the display panel of the embodiment of the invention in FIG. 2A. FIG. 9B is an image of FIG. 7 displayed by the display panel in FIG. 2A which is rotated 90 degrees. In the experiments, each unit of the conventional display panel and each unit of the light emitting device in the embodiment of the invention as the display panel for displaying the image of FIG. 7 have the same dimension.

As shown in FIG. 8A and FIG. 8B, the display screen of the conventional display panel is discontinuous or has significant bright lines and dark lines. In contrast, as shown in FIG. 9A and FIG. 9B, the display panel in the embodiment of the invention has good display quality, and after the display panel is rotated 90 degrees, the display panel still has the good display quality. Therefore, the display panel in the embodiment of the invention is applicable to hand-held display panel, which may significantly enhance the display quality of the transparent display panel.

According to the above, in the light emitting device of the embodiment of the invention, the light emitting region is designed to be located at one corner, one side, the center, or other sites of the unit, so that at least two sides of the light emitting region are surrounded by the light-transmitting region. As a result, the light-transmitting regions and the light emitting regions are disposed in interlace, and the light-transmitting region are substantially dispersed uniformly in the light emitting device. Accordingly, when the light emitting device serves as the display panel, the light emitting device may prevent the display screen from being discontinuous or having significant bright lines and dark lines, which is due to the conventional light-transmitting regions in a stripe-like distribution, so that the display quality of the panel may be significantly improved. Moreover, after the light emitting device which serves as the display panel is rotated 90 degrees, the light-transmitting regions are still dispersed uniformly in the display panel, so that the good display quality of the display panel may be maintained. Therefore, the light emitting device in the embodiment of the invention which serves as the display panel is applicable to both the fixed display panel and the hand-held display panel, and the display quality of the transparent display panel is significantly enhanced. On the other hand, when the light emitting device serves as the light source, the light emitting device may have the advantage of uniform light emission.

It will be apparent to those skilled in the art that various modifications and variations can be made to the structure of the disclosed embodiments without departing from the scope or spirit of the invention. In view of the foregoing, it is intended that the disclosure cover modifications and variations of this specification provided they fall within the scope of the following claims and their equivalents.

What is claimed is:

1. A light emitting device, comprising:
   a plurality of units, each of the plurality of units comprising a light emitting region and a light-transmitting region, wherein in at least one unit, at least two sides of the light emitting region are surrounded by the light-transmitting region, and
   wherein each of the plurality of units comprises a first colored light region, a second colored light region, and a third colored light region which are disposed in the light emitting region, and the light-transmitting region is passed through by a light, such that the light is transmitted out of the light emitting device, and
   wherein the light-transmitting regions of the plurality of units form a light-transmitting mesh pattern, the light-transmitting mesh pattern comprises a plurality of openings, and the light emitting region of each of the plurality of units is located within the openings of the light-transmitting mesh pattern.

2. The light emitting device as claimed in claim 1, wherein the light emitting region of the at least one unit is located at a corner of the unit, so that two sides of the light emitting region are surrounded by the light-transmitting region.

3. The light emitting device as claimed in claim 1, wherein the light emitting region of the at least one unit is located at one side of the unit, so that three sides of the light emitting region are surrounded by the light-transmitting region.

4. The light emitting device as claimed in claim 1, wherein the light emitting region of the at least one unit is located at a center of the unit, and the light-transmitting region is located at a periphery of the unit, so that the light emitting region is encircled by the light-transmitting region.

5. The light emitting device as claimed in claim 1, wherein each of the plurality of units further comprises a transparent region which is disposed in the light-transmitting region.

6. The light emitting device as claimed in claim 5, wherein the first colored light region comprises a first color light emitting layer, the second colored light region comprises a second color light emitting layer, the third colored light region comprises a third color light emitting layer, and the transparent region comprises a transparent layer.

7. The light emitting device as claimed in claim 5, wherein the first colored light region comprises a first color filter pattern, the second colored light region comprises a second color filter pattern, the third colored light region comprises a third color filter pattern, and the transparent region comprises a transparent color filter pattern.

8. The light emitting device as claimed in claim 7, further comprising an active device layer and a display medium layer, wherein the display medium layer is disposed between the active device layer and the first color filter pattern, the second color filter pattern, and the third color filter pattern.

9. The light emitting device as claimed in claim 7, further comprising an active device layer and a display medium layer, wherein the first color filter pattern, the second color filter pattern, and the third color filter pattern are disposed between the active device layer and the display medium layer.

10. The light emitting device as claimed in claim 1, wherein the first colored light region, the second colored light region and the third colored light region are arranged in a side by side manner in the light emitting region.

11. The light emitting device as claimed in claim 1, wherein the first colored light region, the second colored light region and the third colored light region are arranged together to form a quadrilateral shape.

* * * * *